(12) United States Patent
Ito (10) Patent No.: US 10,304,762 B2
(45) Date of Patent: May 28, 2019

(54) MOLDED INTERCONNECT DEVICE, MANUFACTURING METHOD FOR MOLDED INTERCONNECT DEVICE, AND CIRCUIT MODULE

(71) Applicant: OLYMPUS CORPORATION, Hachioji-shi, Tokyo (JP)

(72) Inventor: Keigo Ito, Minowa-machi (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 15/688,631

(22) Filed: Aug. 28, 2017

(65) Prior Publication Data

US 2017/0358526 A1 Dec. 14, 2017

Related U.S. Application Data

(63) Continuation of application No. PCT/JP2016/055698, filed on Feb. 25, 2016.

(30) Foreign Application Priority Data

Mar. 31, 2015 (JP) .................................. 2015-072734

(51) Int. Cl.
*H01L 23/48* (2006.01)
*H01L 23/495* (2006.01)
(Continued)

(52) U.S. Cl.
CPC .... *H01L 23/49572* (2013.01); *H01L 21/4803* (2013.01); *H01L 21/4821* (2013.01);
(Continued)

(58) Field of Classification Search
CPC .. H01L 23/49572; H01L 23/50; H01L 23/525
(Continued)

(56) References Cited

U.S. PATENT DOCUMENTS 5,723,900 A * 3/1998 Kojima ............... H01L 23/3107
257/666
5,879,965 A 3/1999 Jiang et al.
(Continued)

FOREIGN PATENT DOCUMENTS

EP 2354185 A1 8/2011
JP 08078571 * 3/1996 ............. H01L 23/12
(Continued)

OTHER PUBLICATIONS

International Search Report (ISR) and Written Opinion dated May 17, 2016 issued in International Application No. PCT/JP2016/055698.
(Continued)

*Primary Examiner* — Vu A Vu
(74) *Attorney, Agent, or Firm* — Holtz, Holtz & Volek PC (57) ABSTRACT

A molded interconnect device adapted to form a three-dimensional circuit by using laser beams includes: a main body on which the three-dimensional circuit is formed; and a lead portion connected to an external electrode of an external substrate by solder and extending from the main body. The lead portion includes: a lead main body molded from a material same as a material of the main body; and a metal film formed on at least a part of an outer periphery of the lead main body.

10 Claims, 6 Drawing Sheets

(51) Int. Cl.
*H01L 23/50* (2006.01)
*H01L 23/525* (2006.01)
*H01L 23/31* (2006.01)
*H01L 23/498* (2006.01)
*H01L 21/48* (2006.01)

(52) U.S. Cl.
CPC .... *H01L 23/3107* (2013.01); *H01L 23/49548* (2013.01); *H01L 23/49582* (2013.01); *H01L 23/49861* (2013.01); *H01L 23/50* (2013.01); *H01L 23/525* (2013.01)

(58) Field of Classification Search
USPC ........................................................ 257/779
See application file for complete search history.

(56) References Cited

U.S. PATENT DOCUMENTS

| | | | |
|---|---|---|---|
| 6,091,136 | A | 7/2000 | Jiang et al. |
| 6,124,151 | A | 9/2000 | Jiang et al. |
| 6,294,410 | B1 | 9/2001 | Jiang et al. |
| 6,316,824 | B1 | 11/2001 | Jiang et al. |
| 6,323,543 | B1 | 11/2001 | Jiang et al. |
| 7,134,197 | B2 | 11/2006 | Shiffer et al. |
| 7,315,077 | B2 * | 1/2008 | Choi .................... H01L 23/315 |
| | | | 257/666 |
| 8,492,464 | B2 | 7/2013 | Li et al. |
| 2002/0005570 | A1 | 1/2002 | Jiang et al. |
| 2002/0005571 | A1 | 1/2002 | Jiang et al. |
| 2004/0046240 | A1 | 3/2004 | Hasebe et al. |
| 2004/0173882 | A1 | 9/2004 | Jiang et al. |
| 2004/0173896 | A1 | 9/2004 | Jiang et al. |
| 2005/0136569 | A1 | 6/2005 | Shiffer et al. |
| 2006/0049529 | A1 | 3/2006 | Shiffer |
| 2006/0138619 | A1 | 6/2006 | Jiang et al. |
| 2009/0292048 | A1 | 11/2009 | Li et al. |
| 2010/0307799 | A1 * | 12/2010 | Chiang .................. H05K 3/108 |
| | | | 174/255 |
| 2012/0183793 | A1 | 7/2012 | John et al. |
| 2013/0115821 | A1 * | 5/2013 | Golko .................. H01R 13/516 |
| | | | 439/638 |
| 2013/0119525 | A1 * | 5/2013 | Tsuyuno ................ B60L 1/003 |
| | | | 257/675 |

FOREIGN PATENT DOCUMENTS

| | | | | |
|---|---|---|---|---|
| JP | 08078571 | A | * 3/1996 | ............ H01L 23/12 |
| JP | 08078571 | A | 3/1996 | |
| JP | 10294395 | A | 11/1998 | |
| JP | 11145583 | A | 5/1999 | |
| JP | 2965803 | B2 | 10/1999 | |
| JP | 2002314217 | A | 10/2002 | |
| JP | 2012149347 | A | 8/2012 | |
| JP | 2013527689 | A | 6/2013 | |
| JP | 5455028 | B2 | 1/2014 | |
| JP | 2014216554 | A | 11/2014 | |
| JP | 2015201634 | A | 11/2015 | |
| WO | 02061835 | A1 | 8/2002 | |
| WO | 2011095632 | A1 | 8/2011 | |
| WO | 2011134282 | A1 | 11/2011 | |

OTHER PUBLICATIONS

Extended European Search Report (EESR) dated Oct. 29, 2018 issued in counterpart European Application No. 16772001.0.

* cited by examiner

MOLDED INTERCONNECT DEVICE, MANUFACTURING METHOD FOR MOLDED INTERCONNECT DEVICE, AND CIRCUIT MODULE

CROSS-REFERENCE TO RELATED APPLICATIONS

This application is a continuation of PCT international application Ser. No. PCT/JP2016/055698 filed on Feb. 25, 2016 which designates the United States, incorporated herein by reference, and which claims the benefit of priority from Japanese Patent Applications No. 2015-072734, filed on Mar. 31, 2015, incorporated herein by reference.

BACKGROUND

The present disclosure relates to a molded interconnect device, a manufacturing method for a molded interconnect device, and a circuit module.

In the related art, a semiconductor package having a lead frame connected to an external substrate, and formed by sealing a semiconductor chip with a mold resin is widely used (refer to JP 2014-216554 A, for example). Such a semiconductor package is demanded to be downsized, but it is technically difficult to keep product precision while reducing the size of the semiconductor package in which the lead frame is molded by insert molding.

In recent years, developed is a molded interconnect device (hereinafter referred to as "MID") in which a three-dimensional circuit is formed in a main body of a three-dimensional structure in order to downsize the device and reduce the number of components and assembly man-hours (refer to JP 2965803 B, JP 11-145583 A, JP 2002-314217 A and JP 2012-149347 A, for example).

SUMMARY

A molded interconnect device according to one aspect of the present disclosure is adapted to form a three-dimensional circuit by using laser beams, and includes: a main body on which the three-dimensional circuit is formed; and a lead portion connected to an external electrode of an external substrate by solder and extending from the main body, the lead portion including: a lead main body molded from a material same as a material of the main body; and a metal film formed on at least a part of an outer periphery of the lead main body.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

In the following description, a molded interconnect device and a circuit module using the molded interconnect device will be described as a mode to implement the present disclosure (hereinafter referred to as "embodiment"). Additionally, note that the present disclosure is not limited by the embodiment. Furthermore, in the drawings, a same portion is denoted by a same reference sign. Moreover, it should be noted that the drawings are schematically illustrated and a relation between a thickness and a width of each member, a proportion of each member, and the like may differ from those used in practice. Also, note that the drawings may include a portion having sizes or proportions different from each other.

First Embodiment

Figure 1A:
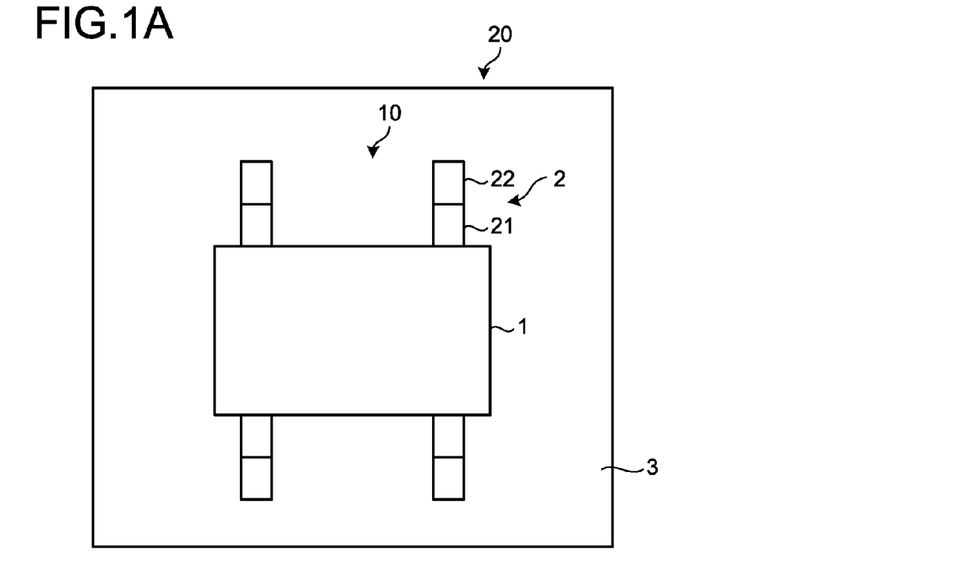
FIG. 1A is a top view of a circuit module using a molded interconnect device according to a first embodiment of the present disclosure.
Figure 1B:
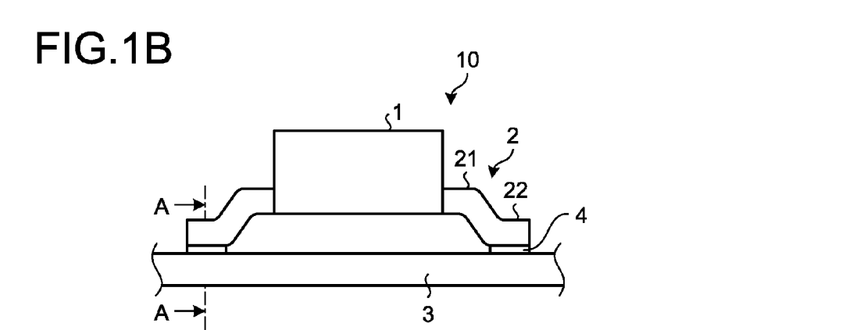
FIG. 1B is a side view of the circuit module in FIG. 1A.
Figure 1C:
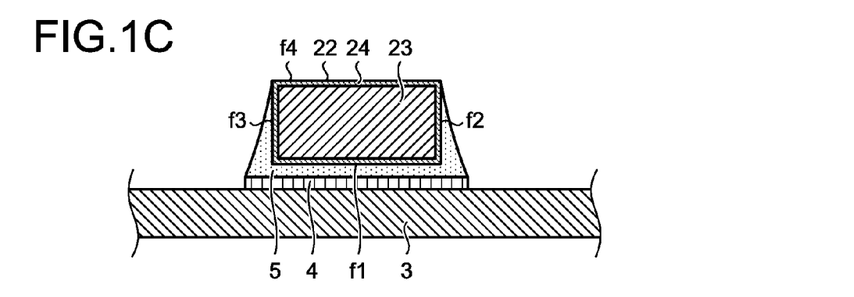
FIG. 1C is a cross-sectional view taken along a line A-A in FIG. 1B.

FIG. 1A is a top view of a circuit module using a molded interconnect device according to first embodiment of the present disclosure. FIG. 1B is a side view of the circuit module in FIG. 1A. FIG. 1C is a cross-sectional view taken along a line A-A in FIG. 1B. A molded interconnect device 10 according to the first embodiment includes a main body 1 having a three-dimensional circuit formed thereon and a lead portion 2 connected to an external electrode of an external substrate by solder and extending from the main body 1. The main body 1 is made of a resin material that may be subjected to injection molding. Additionally, a circuit module 20 includes the molded interconnect device 10 and an external substrate 3, and the external substrate 3 includes an external electrode 4 to which the lead portion 2 of the molded interconnect device 10 is connected by solder 5. In FIGS. 1A to 1C, illustration of a three-dimensional circuit is omitted for simplicity.

The lead portion 2 has a leg portion 21 extending outward from the main body 1 and a connecting portion 22 connected to the external electrode of the external substrate, and is bent between the leg portion 21 and the connecting portion 22.

As illustrated in FIG. 1C, the lead portion 2 includes a lead main body 23 molded from a material same as that of the main body 1, namely, the resin material that may be subjected to injection molding, and a metal film 24 adapted to cover an entire outer periphery of the lead main body 23. The lead main body 23 is formed simultaneously with the main body 1 by injection molding.

Figure 2:
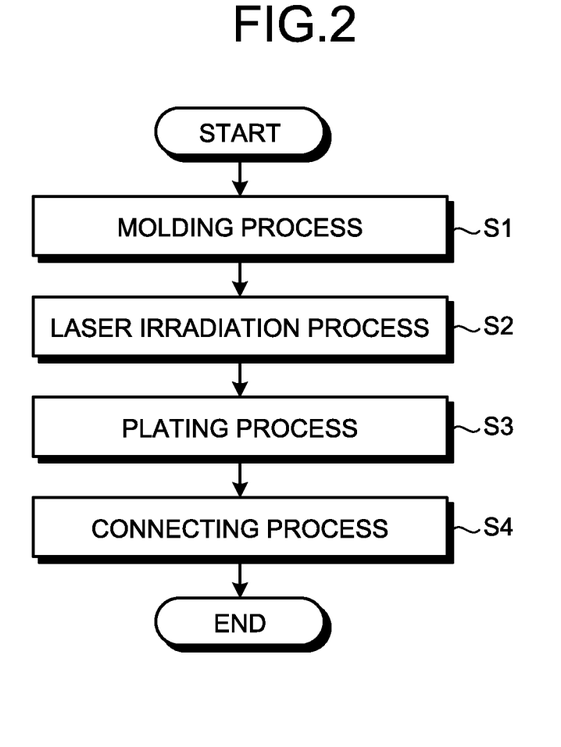
FIG. 2 is a flowchart describing manufacturing processes of the circuit module in FIGS. 1A to 1C.

Next, a manufacturing method for the circuit module 20 will be described. FIG. 2 is a flowchart describing manufacturing processes of the circuit module 20 in FIGS. 1A to 1C.

The processes in FIG. 2 corresponds to manufacturing the molded interconnect device 10 by laser direct structuring (LDS). First, the main body 1 and the lead main body 23 are formed by injection molding or the like (step S1). The resin material that is the material of the main body 1 and the lead main body 23 is added with an organometallic complex.

After the molding process (step S1), the main body 1 and the lead main body 23 are irradiated with laser beams (step S2). A circuit forming portion of the main body 1 and a metal film forming portion of the lead main body 23 are irradiated with laser beams. Surfaces of the main body 1 and the lead main body 23 are slightly removed by irradiation with the laser beams, and also the organometallic complex combined in the resin material is activated, and plating may be performed.

After the laser irradiation process (step S2), a circuit portion and the metal film 24 are formed on the main body 1 and the lead main body 23 by electroless plating (step S3). The electroless plating is carried out by immersion with plating solution for a desired circuit portion and the metal film 24, for example, immersion with electroless copper plating solution in the case of forming a copper film. The metal film 24 may be obtained by forming a film by electroless plating and then further forming a film by electroplating, and also may be obtained by stacking films of different metal kinds.

After the plating processes (step S3), the molded interconnect device 10 is positioned such that the connecting portion 22 is positioned on the external electrode 4 applied with solder, and then the connecting portion 22 is connected to the external electrode 4 by heating and melting the solder (step S4).

In the above processes, as for the resin material that is the material of the main body 1 and the lead main body 23, syndiotactic polystyrene, liquid crystal polymer, or the like, which may be plated by laser irradiation, may also be used instead of the resin material containing the organometallic complex.

Additionally, the molded interconnect device 10 may also be manufactured by a known microscopic integrated processing technology (MIPTEC) or SKW-L1 instead of the above-described LDS.

For example, in the MIPTEC, the main body 1 and the lead main body 23 are processed by molding such as injection molding, and then a thin metal film is formed on the main body 1 and the entire portion of the lead main body 23 by chemical plating, sputtering, or the like. After that, a periphery of the circuit portion is removed by laser beams and then subjected to electroplating, and an excessive thin metal film is etched. The molded interconnect device 10 may be manufactured by forming the metal film 24 by electroplating without laser beam irradiation on the thin metal film formed on the lead main body 23.

Additionally, in the SKW-L1, the main body 1 and the lead main body 23 are processed by molding such as injection molding, the molded main body 1 and entire surfaces of the lead main body 23 are roughened by etching or the like, and a catalyst is applied to the entire portions. After that, the thin metal film is formed on the main body 1 and the entire lead main body 23 by electroless plating, the periphery of the circuit portion is removed by laser beams, and electroplating is performed, and then an excessive thin metal film is etched. The molded interconnect device 10 may be manufactured by forming the metal film 24 by electroplating without laser beam irradiation on the thin metal film formed on the lead main body 23.

In the first embodiment, since the lead portion 2 is formed by injection molding and plating without performing insert molding for a metal-made lead, the molded interconnect device 10 having excellent precision may be achieved even when downsized.

Second Embodiment

Figure 3A:
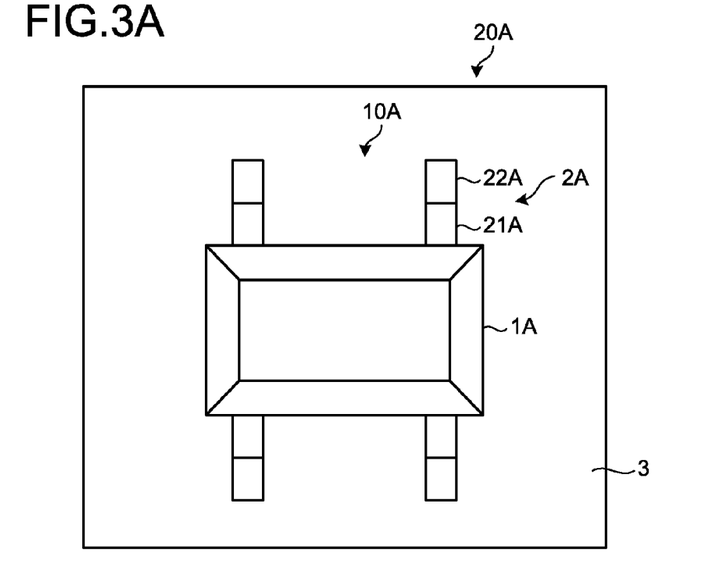
FIG. 3A is a top view of a circuit module using a molded interconnect device according to a second embodiment of the present disclosure.
Figure 3B:
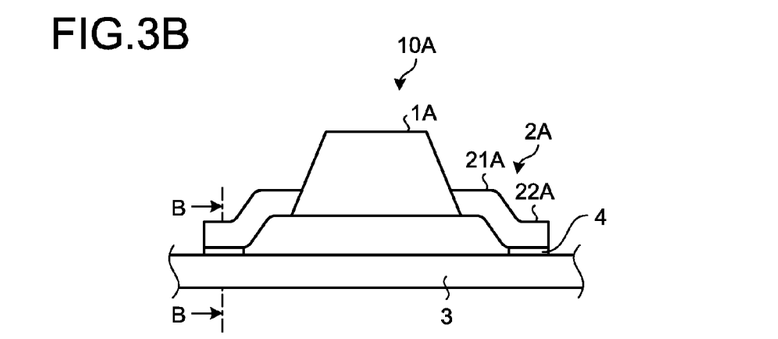
FIG. 3B is a side view of the circuit module in FIG. 3A.

In a molded interconnect device according to a second embodiment, a connecting portion has a trapezoidal cross-sectional shape. FIG. 3A is a top view of a circuit module using the molded interconnect devices according to the second embodiment of the present disclosure. FIG. 3B is a side view of the circuit module in FIG. 3A. 3C is a cross-sectional view taken along a line B-B in FIG. 3B. Note that illustration of a three-dimensional circuit is omitted in FIGS. 3A to 3C in a manner similar to a first embodiment.

Figure 3C:
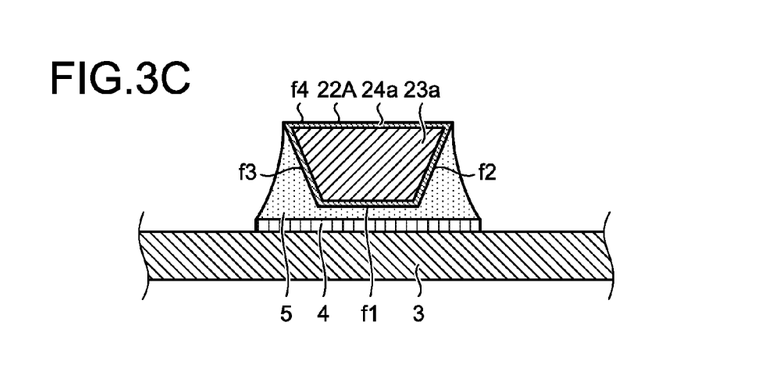
FIG. 3C is a cross-sectional view taken along a line B-B in FIG. 3B.

As illustrated in FIG. 3C, similar to a molded interconnect device 10 of the first embodiment, a molded interconnect device 10A according to the second embodiment includes a lead portion 2A including: a lead main body 23a molded from a material same as a main body 1A, namely, a resin material that may be subjected to injection molding; and a metal film 24a adapted to cover an entire outer periphery of the lead main body 23a. The lead portion 2A is formed of a leg portion 21A extending outward from the main body 1A and a connecting portion 22A connected to an external electrode 4 of an external substrate 3, and is bent between the leg portion 21A and the connecting portion 22A. The connecting portion 22A has a trapezoidal shape in which a length of a bottom surface f1 in the cross-section perpendicular to the extending direction is shorter than that of a surface f4 that is a top surface. Additionally, the main body 1A also has a quadrangular frustum shape obtained by cutting an upper portion of a square pyramid.

The connecting portion 22A has a shape in which the entire outer periphery may be irradiated with laser beams from two opposing directions. Furthermore, the connecting portion 22A has the surface f1 parallel to the external electrode 4 in the cross-section perpendicular to the extending direction of the connecting portion 22A. Since the surface f1 parallel to the external electrode 4 is provided, connection strength may be improved when connected to the external electrode 4 by solder 5. Additionally, since the length of the surface f1 is shorter than the opposing surface f4, a length of the external electrode 4 to be connected may be shortened, and packaging density of the external substrate 3 may be improved.

As far as provided is the shape in which the entire outer periphery may be irradiated with laser beams at the time of emitting the laser beams from two directions opposing to the leg portion 21A (same direction as an emitting direction of the laser beams to the connecting portion 22A), the leg portion 21A does not need have the cross-sectional shape same as that of the connecting portion 22A.

Furthermore, the molded interconnect device 10A according to the second embodiment is manufactured by LDS, but has a shape such that the entire outer periphery of the connecting portion 22A may be irradiated with laser beams from the two directions opposing to the connecting portion 22A.

A method of irradiating the connecting portion 22A (lead main body 23a before forming the metal film 24a in FIG. 4) with laser beams will be described with reference to FIG. 4.

To irradiate the lead main body 23a with laser beams, the surface f4 that is the upper surface of the lead main body 23a is first irradiated with the laser beams by a laser irradiation device 30, and also the surface f4 of the lead main body 23a is slightly removed and a resin material is activated. After that, the entire outer periphery of the lead main body 23a may be irradiated with laser beams by rotating the surface f1 of the lead main body 23a so as to become an upper surface, and irradiating surfaces f1, f2, and f3 of the lead main body 23a with the laser beams. In the case where an angle formed between the surface f2 or f3 and the laser beams is less than 10 degrees, an effect of laser beam irradiation may not be obtained. Therefore, preferably, the angle formed between the surfaces f2 or f3 and the laser beam is 10 degrees or more, in other words, preferably, the angle between the surface f4 and each of the surfaces f2 and f3 is 80 degrees or less.

Figure 4:
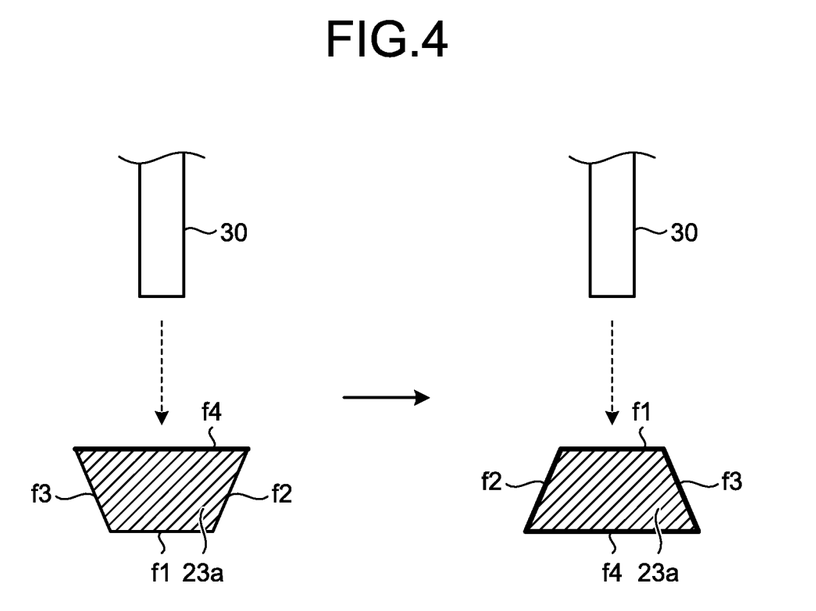
FIG. 4 is a view to describe irradiation of laser beams on a lead main body of the molded interconnect device according to the second embodiment.

Additionally, in FIG. 4, one laser irradiation device 30 may be installed for each of the surface f4 and the surface f1 of the lead main body 23a in a vertical direction, and the surfaces f1 to f4 of the lead main body 23a may also be irradiated with laser beams simultaneously from the vertical two directions. In the present specification, "emitting laser beams from two opposing directions" includes: a case of "emitting laser beams simultaneously from a laser irradiation device installed in each of opposing directions"; and a case of "emitting laser beams to any surface of the connecting portion from one laser irradiation device, and rotating the connecting portion by 180 degrees, and then emitting the laser beams to a surface side opposing the surface first irradiated with the laser beams".

On the other hand, for example, in the molded interconnect device 10 of the first embodiment having a cross-section perpendicular to an extending direction of a connecting portion 22, the number of processes is increased in the case of irradiating surfaces f1, f2, f3, and f4 with laser beams because it is necessary to reset the molded interconnect device 10 even in the case where two laser irradiation devices 30 are provided in opposing directions, and further it is also necessary to reset the molded interconnect device 10 three times such that the surfaces f1 to f4 are irradiated respectively in the case of having one laser irradiation device. Meanwhile, in terms of facilitating positioning of the molded interconnect device 10A at the time of laser beam irradiation, laser beams are emitted from two opposing directions of either "vertical" or "horizontal" direction.

Since the connecting portion 22A of the molded interconnect device 10A according to the second embodiment has the trapezoidal shape, the number of laser irradiation processes may be reduced and a manufacturing processes may be shortened. Moreover, even when the molded interconnect device 10A is downsized, the lead portion may be easily manufactured with high precision. Furthermore, the shape of main body 1A of the molded interconnect device 10A is a shape, namely, the quadrangular frustum shape in which the entire outer periphery may be irradiated with laser beams from the two opposing directions (the same direction as the laser beam emitting direction to the connecting portion 22A), a time required for the laser irradiation process may be reduced.

Meanwhile, in the second embodiment, as far as provided is the shape in which the entire outer periphery may be irradiated with laser beams from the two opposing directions (direction same as the laser beam emitting direction to the connecting portion 22A), the shape of the main body 1A is not limited to the quadrangular frustum shape.

Figure 5:
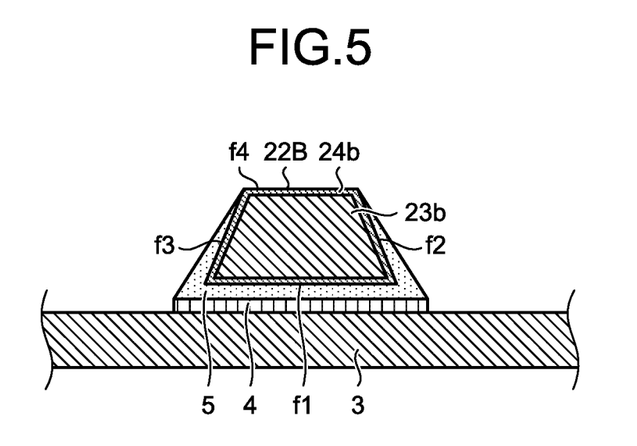
FIG. 5 is a cross-sectional view of a lead portion of a molded interconnect device according to a first modified example of the second embodiment of the present disclosure.

Additionally, as far as provided is the shape in which the entire outer periphery may be irradiated with laser beams from the two opposing directions, the shape of the cross-section perpendicular to the extending direction of the connecting portion is not limited to the shape of the second embodiment. FIG. 5 is a cross-sectional view of a lead portion of a molded interconnect device according to a first modified example of the second embodiment of the present disclosure.

In the molded interconnect device according to the first modified example of the second embodiment, a connecting portion 22B has a trapezoidal shape in which a length of a surface f1 that is a bottom surface in a cross-section perpendicular to an extending direction is longer than that of a surface f4 that is a top surface.

Additionally, preferably, an angle between the surface f1 and each of surfaces f2 and f3 is 80 degrees or less in order to obtain an effect of laser beam irradiation. A leg portion not illustrated does not need to have a cross-sectional shape same as that of the connecting portion 22B as far as provided is the shape in which an entire outer periphery may be irradiated with laser beams from two opposing directions.

Since the connecting portion 22B has the surface f1 parallel to an external electrode 4 in the cross-section perpendicular to the extending direction of the connecting portion 22B and furthermore the surface f1 has the long length, connection strength may be further improved when connected to the external electrode 4 by solder 5. Additionally, manufacturing processes may be shortened because the connecting portion 22B has the shape in which the entire outer periphery may be irradiated with laser beams from the two opposing directions, in other words, the surfaces f2, f3, and f4 may be irradiated in the case of emitting the laser beams from above and the surface f1 may be irradiated in the case of emitting the laser beams from below.

Figure 6:
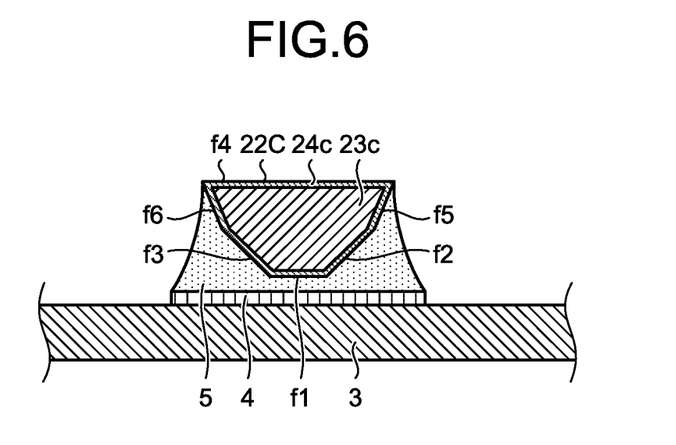
FIG. 6 is a cross-sectional view of a lead portion of a molded interconnect device according to a second modified example of the second embodiment of the present disclosure.

Additionally, as far as provided is the shape in which the entire outer periphery may be irradiated with laser beams from the two opposing directions, the shape of the cross-section perpendicular to the extending direction of the connecting portion is not limited to the trapezoidal shape. FIG. 6 is a cross-sectional view of a lead portion of a molded interconnect device according to a second modified example of the second embodiment of the present disclosure.

In the molded interconnect device according to the second modified example of the second embodiment, a connecting portion 22C has a hexagonal shape in a cross-section perpendicular to an extending direction thereof. Preferably, an angle formed between a surface f4 and each of extending surfaces of surfaces f2 and f3 and an angle formed between the surface f4 and each of surfaces f5 and f6 is 80 degrees or less in order to obtain an effect of laser beam irradiation. A leg portion not illustrated does not need to have a cross-sectional shape same as that of the connecting portion 22C as far as provided is the shape in which an entire outer periphery may be irradiated with laser beams in two opposing directions.

In the connecting portion 22C, since a length of the surface f1 is shorter than the opposing surface f4, a length of the external electrode 4 to be connected may be shortened, and packaging density of the external substrate 3 may be improved. Additionally, manufacturing processes may be shortened because the connecting portion 22C has the shape in which the entire outer periphery may be irradiated with laser beams from the two opposing directions, in other words, the surface f4 may be irradiated in the case where the laser beams is emitted from above, and the surfaces f1 to f3, f5, and f6 may be irradiated in the case of emitting the laser beams from below.

Figure 7:
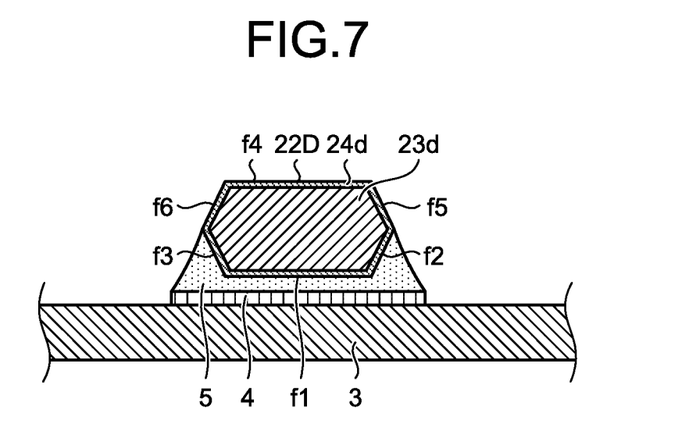
FIG. 7 is a cross-sectional view of a lead portion of a molded interconnect device according to a third modified example of the second embodiment of the present disclosure.

Additionally, as far as the provided is the shape in which the entire outer periphery may be irradiated with laser beams from the two opposing directions, the shape of the cross-section perpendicular to the extending direction of the connecting portion may have a shape illustrated in FIG. 7. FIG. 7 is a cross-sectional view of a lead portion of a molded interconnect device according to a third modified example of the second embodiment of the present disclosure.

In the molded interconnect device according to the third modified example of the second embodiment, a connecting portion 22D has a hexagonal shape in a cross-section perpendicular to an extending direction thereof. Preferably, an angle formed between a surface f4 and each of extending surfaces of surfaces f2 and f3 and an angle formed between a surface f1 and each of extending surfaces of surfaces f5 and f6 is 80 degrees or less in order to obtain an effect of laser beam irradiation. A leg portion not illustrated does not need to have a cross-sectional shape same as that of the connecting portion 22D as far as provided is the shape in which an entire outer periphery may be irradiated with laser beams in two opposing directions.

Since the connecting portion 22D has the surface f1 parallel to an external electrode 4 and a length of the surface f1 is long, connection strength may be further improved when connected to the external electrode 4 by solder 5. Additionally, manufacturing processes may be shortened because the connecting portion 22D has the shape in which the entire outer periphery may be irradiated when laser beams are emitted from the two opposing directions, in other words, the surfaces f4 to f6 may be irradiated in the case of emitting the laser beams from above, and the surfaces f1 to f3 may be irradiated in the case of emitting the laser beams from below.

Figure 8:
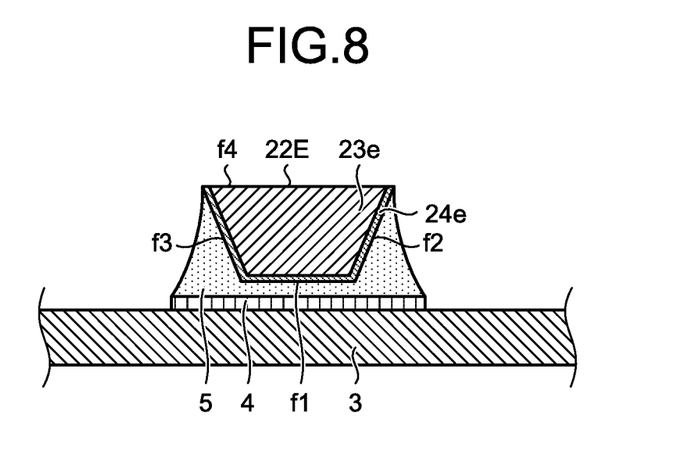
FIG. 8 is a cross-sectional view of a lead portion of a molded interconnect device according to a fourth modified example of the second embodiment of the present disclosure.

Additionally, a metal film may not be needed to be formed on an entire outer periphery of a lead main body. FIG. 8 is a cross-sectional view of a lead portion of a molded interconnect device according to a fourth modified example of the second embodiment of the present disclosure. In the molded interconnect device according to the fourth modified example of second embodiment, a connecting portion 22E has a trapezoidal shape in which a length of a bottom surface f1 is shorter than a top surface f4 in a cross-section perpendicular to an extending direction thereof. Furthermore, a metal film 24e is formed on the surface f1 that is the bottom surface and surfaces f2 and f3 adjacent to the surface f1, and is not formed on the surface f4 that is the top surface. Additionally, preferably, an angle between the surface f4 and each of the surfaces f2 and f3 is 80 degrees or less in order to obtain an effect of laser beam irradiation.

Since the metal film 24e is formed on the surface f1 that is the bottom surface and the surfaces f2 and f3 adjacent to the surface f1, solder fillets are formed on the surfaces f2 and f3, and the connecting portion 22E may ensure connection strength. Additionally, manufacturing processes may be further shortened because the metal film 24e may be formed by irradiating the surfaces f1 to f3 with laser beams from a lower side. Meanwhile, a leg portion not illustrated has a surface that may be irradiated from the lower side, and the metal film is formed on the surface irradiated with the laser beams, and the metal film 24e of the connecting portion 22E is electrically connected to a circuit portion of the main body.

According to the present disclosure, the main body and the lead main body of the molded interconnect device may be simultaneously molded in the molding process, and the three-dimensional circuit and the metal film of the lead main body may be simultaneously formed in the plating process. Therefore, the molded interconnect device including a lead portion may be manufactured by the small number of processes while keeping product precision even when downsized.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A molded interconnect device comprising:
a main body comprising a three-dimensional circuit; and
a lead portion extending from the main body;
wherein the lead portion comprises:
  a lead main body; and
  a metal film;
wherein both the main body and the lead main body are parts of a same molded body;
wherein the lead portion includes:
  a leg portion extending outward from the main body; and
  a connecting portion configured to be connected to an external electrode of an external substrate;
wherein in a cross-section perpendicular to the extending direction of the connecting portion, an outer periphery of the connecting portion has at least four sides, including a bottom side configured to be parallel to the external electrode;
wherein, in the cross-section perpendicular to the extending direction of the connecting portion, the metal film covers only three sides of the at least four sides of the outer periphery of the connecting portion; and
wherein the only three sides that are covered with the metal film are the bottom side and two sides adjacent to the bottom side.

2. The molded interconnect device according to claim 1, wherein the three-dimensional circuit is formed by laser direct structuring (LDS).

3. The molded interconnect device according to claim 1, wherein the three-dimensional circuit and the metal film are formed by laser direct structuring (LDS).

4. The molded interconnect device according to claim 1, wherein, in a cross-section perpendicular to the extending direction of the lead main body, an outer periphery of the lead main body has a trapezoidal shape.

5. The molded interconnect device according to claim 1, wherein, in the cross-section perpendicular to the extending direction of the connecting portion, the outer periphery of the connecting portion has a trapezoidal shape.

6. The molded interconnect device according to claim 1, wherein, in the cross-section perpendicular to the extending direction of the lead main body, the outer periphery of the lead main body has a hexagonal shape.

7. A manufacturing method for a molded interconnect device, the method comprising:

molding a molded body to include a main body and a lead main body;

irradiating the main body and the lead main body with laser beams; and performing electroless plating on the main body and the lead main body which have been irradiated with the laser beams, thereby forming a three-dimensional circuit on the main body, and forming a metal film on the lead main body;

wherein, in a cross-section perpendicular to the extending direction of the lead main body, an outer periphery of the lead main body has at least four sides, and the metal film is formed to cover at least three contiguous sides of the at least four sides.

8. The method according to claim 7, wherein the molding comprises molding the molded body from a resin material including an organometallic complex; and wherein the laser beams irradiated to the main body and the lead main body activate the organometallic complex in the resin material.

9. The method according to claim 7, wherein irradiating the lead main body with the laser beams comprises emitting laser beams to the lead main body from two opposing directions; and wherein, in the cross-section perpendicular to the extending direction of the lead main body, the metal film covers all sides of the outer periphery of the lead main body.

10. The method according to claim 7, wherein the lead portion includes a leg portion extending outward from the main body, and a connecting portion configured to be connected to an external electrode of an external substrate;

wherein irradiating the lead main body with the laser beams comprises emitting laser beams to the connecting portion from only one side of the connecting portion;

wherein in a cross-section perpendicular to the extending direction of the connecting portion, an outer periphery of the connecting portion has at least four sides, including a bottom side configured to be parallel to the external electrode;

wherein, in the cross-section perpendicular to the extending direction of the connecting portion, the metal film covers only three sides of the at least four sides of the outer periphery of the connecting portion; and wherein the only three sides that are covered with the metal film are the bottom side and two sides adjacent to the bottom side.

\* \* \* \* \*